United States Patent
Donaghy et al.

(10) Patent No.: US 6,892,362 B1
(45) Date of Patent: May 10, 2005

(54) HYBRID STATE MACHINE

(75) Inventors: John Donaghy, Belfast (GB); Claire Greenwood, Belfast (GB); James McKee, Belfast (GB)

(73) Assignee: Nortel Networks Limited, St. Laurent (CA)

( * ) Notice: Subject to any disclaimer, the term of this patent is extended or adjusted under 35 U.S.C. 154(b) by 118 days.

(21) Appl. No.: 10/369,884

(22) Filed: Feb. 20, 2003

(51) Int. Cl.[7] .............................................. G06F 17/50
(52) U.S. Cl. ............................................. 716/1; 716/4
(58) Field of Search ........................................ 716/1, 4

(56) References Cited

U.S. PATENT DOCUMENTS

| | | | | |
|---|---|---|---|---|
| 5,357,614 A | * | 10/1994 | Pattisam et al. | 710/68 |
| 5,469,553 A | * | 11/1995 | Patrick | 713/323 |
| 5,640,398 A | * | 6/1997 | Carr et al. | 370/376 |
| 5,680,592 A | * | 10/1997 | Priem | 703/27 |
| 5,914,902 A | * | 6/1999 | Lawrence et al. | 365/201 |
| 6,349,405 B1 | * | 2/2002 | Welfeld | 717/170 |
| 6,741,613 B1 | * | 5/2004 | Morelos-Zaragoza et al. | 370/503 |

OTHER PUBLICATIONS

Borshchev et al."Java Engin for UML Based Hybrid State Machines", Dec. 2000, IEEE Simulation Conference Proceedings, Winter, vol. 2, pp. 1888–1894.*

* cited by examiner

*Primary Examiner*—Leigh M. Garbowski
*Assistant Examiner*—Sun James Lin
(74) *Attorney, Agent, or Firm*—Barnes & Thornburg

(57) ABSTRACT

One aspect of the invention provides an apparatus for implementing a state machine. The apparatus comprises a software component and a hardware component each arranged to implement at least one state and to be responsive to at least one input event to perform one or more functions. The apparatus thus implements a hybrid state machine offering the fast performance of a hardware implementation where required, while offering the flexibility and reduced testing times of a software implementation in respect of any aspect of the state machine not implemented in hardware. The apparatus is particularly suited for use in telecommunications systems and, in one embodiment, is arranged to perform pointer interpretation in accordance with ITU-T standard G.783.

16 Claims, 5 Drawing Sheets

FIG. 1 - PRIOR ART

HYBRID STATE MACHINE

FILED OF THE INVENTION

The present invention relates to state machine systems. The invention relates particularly to state machine systems for controlling high speed real-time processes.

BACKGROUND TO THE INVENTION

Many types of control system include one or more state machine for implementing one or more control functions. A state machine is essentially a controller which controls the operation of an apparatus or the performance of a process.

State machines are commonly implemented as software in the form of a computer program for controlling a microcontroller or microprocessor. One advantage of software implemented state machines is their flexibility—a computer programmer may readily modify the state machine by changing the computer program that describes it. Also, the time required to test a software state machine can be significantly less than that of corresponding hardware, especially where the hardware comprises an Integrated Circuit which requires simulation as part of the testing process. A disadvantage of software implemented state machines is relatively slow operation speed. As a result, software state machines are increasingly unsuitable for many real-time applications, particularly in the field of telecommunications.

It is also known to implement state machines in hardware. Typically, a hardware state machine comprises one or more combinational logic circuits. Hardware state machines are relatively fast in operation but suffer from the disadvantage of being inflexible—modifying hardware is generally much more impractical than modifying software, especially where the hardware comprises an integrated circuit. Also, the time required to test a hardware state machine is long in comparison with a corresponding software state machine.

It would be desirable, therefore, to provide a state machine which provides improved flexibility combined with improved performance.

SUMMARY OF THE INVENTION

Accordingly, a first aspect of the invention provides an apparatus for implementing a state machine having a plurality of states and being responsive to one or more input events to perform one or more functions, the apparatus comprising a software component arranged to implement at least one of said states and being responsive to at least one of said input events to perform one or more functions; and a hardware component arranged to implement at least one of said states and being responsive to at least one of said input events to perform one or more functions.

The apparatus thus implements a hybrid state machine offering the fast performance of a hardware implementation where required, while offering the flexibility and reduced testing times of a software implementation in respect of any aspect of the state machine not implemented in hardware.

Preferably, at least one of said states is common to both the hardware component and the software component, and wherein, in respect of the or each common state, one of said hardware component or said software component is arranged to perform one or more functions in response to one or more input events. More preferably, the other of said hardware component or said software component is arranged to respond to said one or more input events at least to the extent that is necessary to effect a state transition.

Preferably, in respect of the or each common state, the other of said hardware component or said software component is arranged to perform one or more functions in response to one or more other input events.

Preferably, in response to effecting a transition from a current state to a next state which is common to both said hardware component and said software component, at least one of said software component and said hardware component is arranged to inform the other of said software component and said hardware component that the next state is adopted.

More preferably, the software component is arranged to implement all of said states and is responsive to said at least one input event at least to the extent that is necessary to effect a transition from a current state to a next state, the software component being further arranged to inform the hardware component when a next state is adopted.

In the preferred embodiment, the state machine is arranged to perform pointer interpretation in accordance with ITU-T standard G.783.

Preferably, said hardware component is arranged to implement the Normal state and, when the Normal state is adopted, to respond to an input event in the form of a third successive consistent new valid pointer by performing a function in the form of setting the pointer value to the value of the new valid pointer.

Preferably, the hardware component is arranged to implement the Normal state and a Loss of Pointer state, and, when in said Loss of Pointer state, is arranged to respond to an input event in the form of a third successive consistent line pointer event to perform a function including effecting a transition to the Normal state. More preferably, said Loss of Pointer state is an intermediate state which is entered from the Loss of Pointer (LOP) state provided for in ITU-T G.783 upon receipt of two consistent line pointer events.

Preferably, the hardware component is arranged to implement the Normal state and an Alarm Indication Signal state, and, when in said Alarm Indication Signal state, is arranged to respond to an input event in the form of a third successive consistent line pointer event to perform a function including effecting a transition to the Normal state. More preferably, said Alarm Indication Signal state is an intermediate state which is entered from the Alarm Indication Signal (AIS) state provided for in ITU-T G.783 upon receipt of two consistent line pointer events.

A second aspect of the invention provides a state machine system comprising a control apparatus and a target system, the control apparatus being arranged to receive one or more input events from the target system, to perform one or more input event handling functions, and to transmit one or more output events to the target system, wherein said control apparatus comprises an apparatus according to the first aspect of the invention.

Preferably, the hardware component of the control apparatus and the software component of the control apparatus are each arranged to receive input events from said target system and to transmit output events to said target system. Preferably, arranged to serve as a Synchronous Digital Hierarchy (SDH)/Synchronous Optical Network (SONET) pointer processing system, wherein said target system comprises a low order pointer processor (LOPP) and/or a high order pointer processor (HOPP).

A third aspect of the invention provides a network element for use in a synchronous transport network, the network element comprising a state machine system according to the second aspect of the invention.

A fourth aspect of the invention provides a method of implementing a state machine, the method comprising arranging said software component to implement at least one of said states and to be responsive to at least one of said input events to perform one or more functions; and arranging said software component to implement at least one of said states and to be responsive to at least one of said input events to perform one or more functions.

For use in an apparatus for implementing a state machine having a plurality of states and being responsive to one or more input events to perform one or more functions, the apparatus comprising a software component and a hardware component, a fifth aspect of the invention provides a computer program product comprising computer usable instructions for causing a computer to cause said software component to implement at least one of said states and to be responsive to at least one of said input events to perform one or more functions.

Other advantageous aspects and features of the invention will be apparent to those ordinarily skilled in the art upon review of the following description of a specific embodiment of the invention and with reference to the accompanying drawings.

The preferred features as described herein above or as described by the dependent claims filed herewith may be combined as appropriate, and may be combined with any of the aspects of the invention as described herein above or by the independent claims filed herewith, as would be apparent to those skilled in the art.

BRIEF DESCRIPTION OF THE DRAWINGS

A specific embodiment of the invention is now described by way of example and with reference to the accompanying drawings in which.

DETAILED DESCRIPTION OF THE DRAWINGS

Figure 1:
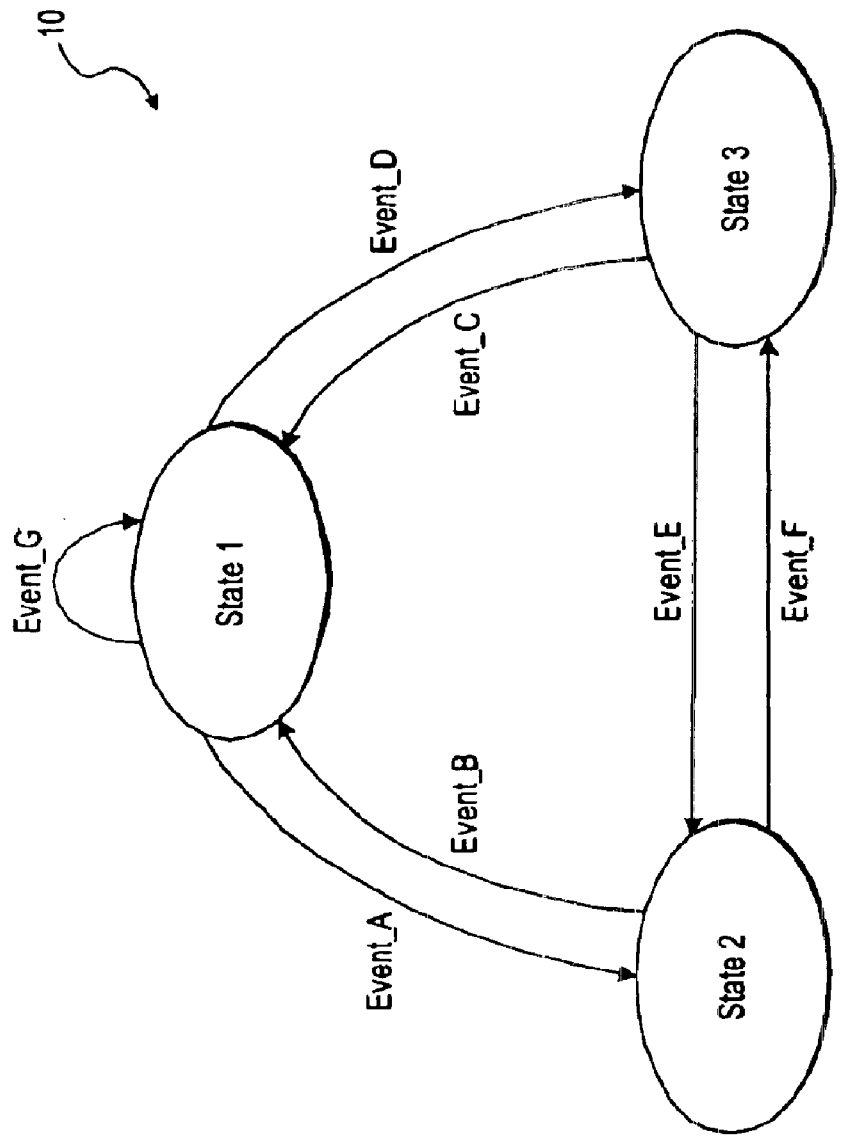
FIG. 1 is an example of a state diagram describing the operation of a state machine.

Referring now to FIG. 1 of the drawings, there is shown, generally indicated as 10, an example of a conventional state diagram which describes the operation of a state machine (not shown in FIG. 1).

In general, a state machine is a device which stores the state of an apparatus or process (not shown) under control and which is responsive to one or more inputs to change the state and/or to cause one or more outputs or actions to be generated. A conventional state machine may be implemented as one or more computer programs (software implementation) or as one or more logic circuits (hardware implementation).

Typically, a state machine is operable between a plurality of states. When in a given state, the state machine is responsive to one or more inputs (commonly called "input events") to cause one or more functions, or event handling operations, to be performed. The performance of a function may result in a transition to another state and/or the generation of one or more outputs (commonly called "output events").

In FIG. 1, the state diagram 10 comprises, for illustration purposes only, three states namely, State 1, State 2 and State 3. State 1 is assumed to be the initial state. When in State 1, receipt of input event Event_A causes the state machine to perform one or more functions resulting in a transition to State 2, while receipt of input event Event_D causes the state machine to perform one or more functions resulting in a transition to State 3. In response to input events Event_A or Event_D, the state machine may also cause one or more outputs (not shown) to be generated, which outputs are typically used to control the apparatus or process which is under the control of the state machine. Input Event_G does not result in a state transition but only in the generation of one or more outputs. Similarly, when in State 2, input Event_B causes a state transition to State 1, while input Event_F causes a state transition to State 3. When in State 3, input Event_C causes a state transition to State 1, while input Event_E causes a state transition to State 2. Input events B, F, C and E may also cause one or more respective outputs to be generated.

A variety of conventional techniques could be used to design a hardware or software state machine for implementing the state diagram 10. It is observed, however, that in many applications, including real-time telecommunications applications, some functions and/or state transitions are more time critical than others. Hence, state machines embodying the invention advantageously comprise a hardware component and a software component so that some functions and/or state transitions may be performed by hardware, while other functions and or state transitions may be performed by software. This allows time sensitive functions and/or state transitions to be performed relatively quickly while offering flexibility in respect of those functions and/or state transitions implemented by software. State machines embodying the invention may therefore be referred to as hybrid state machines in that they comprise both software and hardware components.

Figure 2:
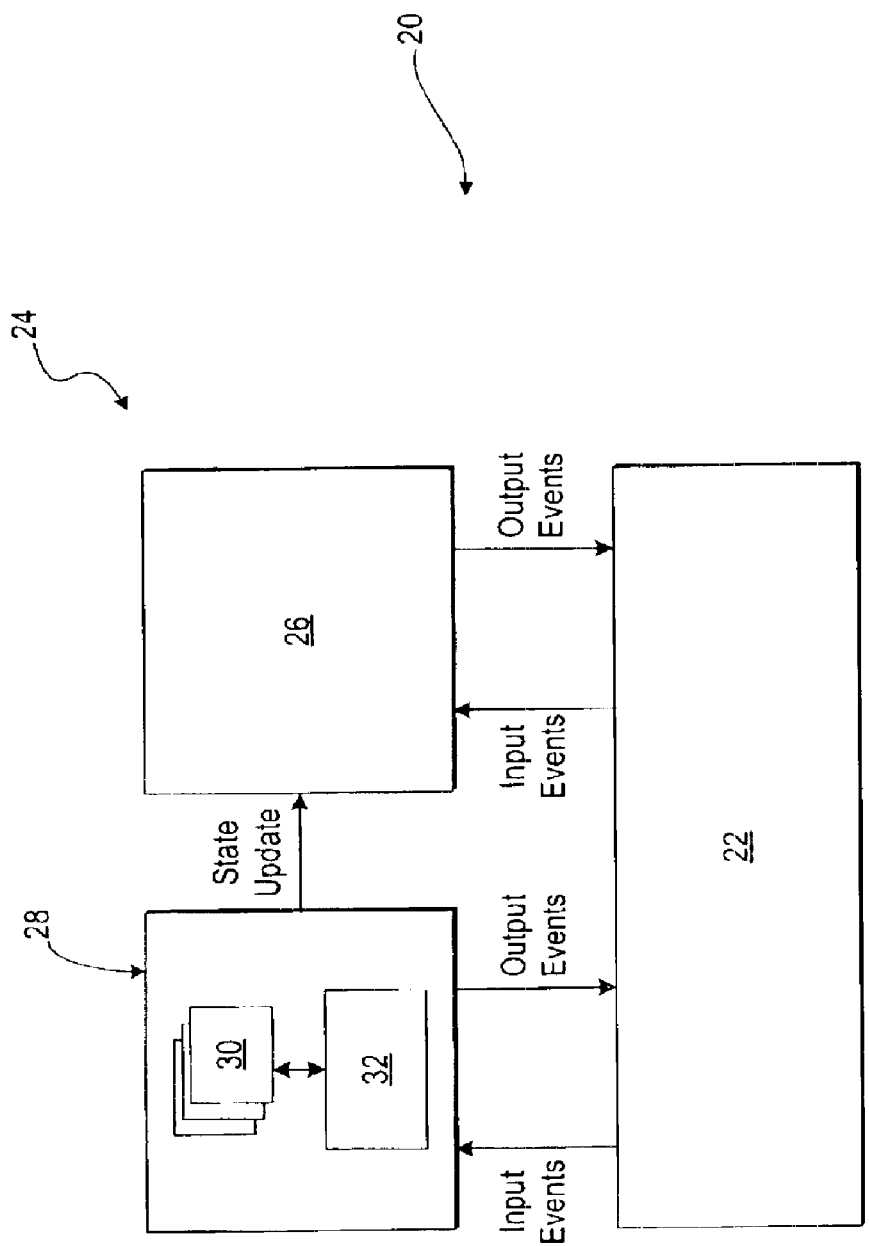
FIG. 2 is a block diagram of a state machine system comprising a state machine embodying one aspect of the present invention.

Referring now to FIG. 2, there is shown, generally indicated as 20, a state machine system, or control system. The control system 20 includes a target system 22 under the control of a control apparatus, generally indicated as 24. The control apparatus 24 comprises a state machine having a hardware component 26 and a software component 28.

The target system 22 may comprise any apparatus and/or process, including computer programs, that requires control and may be comprised of hardware and/or software components (not shown). The target system 22 is arranged to generate one or more input events which are communicated to both the hardware component 26 and the software component 28 of the control apparatus 24. Typically, an input event comprises an event identification (Event_ID) and may also include event data.

The hardware and software components 26, 28 of control apparatus 24 together implement a state machine for controlling target system 22. The hardware component 26 comprises one or more logic circuit (not shown) arranged to perform one or more functions and/or state transitions and/or to generate one or more output in response to receipt of one or more input event from the target system 22. Outputs, or output events, generated by the hardware component 26 are communicated to the target system 22 for the operation or control thereof.

The software component 28 comprises one or more computer program 30 arranged to run on a computer typically in the form of a microprocessor or microcontroller 32. The software component 28 is responsive to input events received from the target system 22 to perform one or more function and/or state transition and/or to generate one or more output these may be referred to as event handling operations. Outputs, or output events, generated by the hardware component 28 are communicated to the target system 22 for the operation or control thereof.

For at least one state of the state machine, the hardware component 26 is arranged to respond to at least one input event by performing appropriate event handling operations, including a state transition and/or one or more other functions and/or generating one or more output, as applicable. The software component 28 is arranged to respond to the or each input event to which the hardware component 26 does not respond, i.e. not handled by the hardware component 26. Where one of the hardware or software components 26, 28 is arranged to respond to an input event, the other of the hardware or software components 26, 28 may be arranged to do nothing or may be arranged to perform a shadow state transition and/or one or more shadow functions.

Advantageously, the hardware component 26 is arranged to perform functions and/or state transitions that are time sensitive and which could not readily be performed by software in the required time. The hardware component 26 need only implement, or support, the states and associated functions, transitions and/or outputs in respect of which it is arranged to respond.

In the preferred embodiment, the software component 28 is arranged to implement, or support, all states of the state machine and to respond to each received input event at least to the extent that is necessary to determine state transitions. This facilitates control of the state machine. In respect of those functions and/or state transitions and/or outputs that are implemented by the hardware component 26, the software component 28 is advantageously arranged to perform corresponding shadow state transitions and/or functions, as applicable, although there is no need for the software component 28 to generate corresponding shadow outputs.

By way of illustration, it is assumed that the control apparatus 24, being a preferred embodiment, is to implement a state machine described by the state diagram 10 of FIG. 1. It is assumed also that, when in State 1, the state machine is required to perform a function in response to input Event_G (i.e. handle Event_G) which is time sensitive and which could not be performed quickly enough by software. It is also assumed that, when in State 3, the state machine is required to perform a function and a state transition to State 2 in response to input Event_E which is time sensitive and which could not be performed quickly enough by software. Accordingly, handling input Events G and E is allocated to the hardware component 26. All other input events are handled by the software component 28.

Figure 3B:
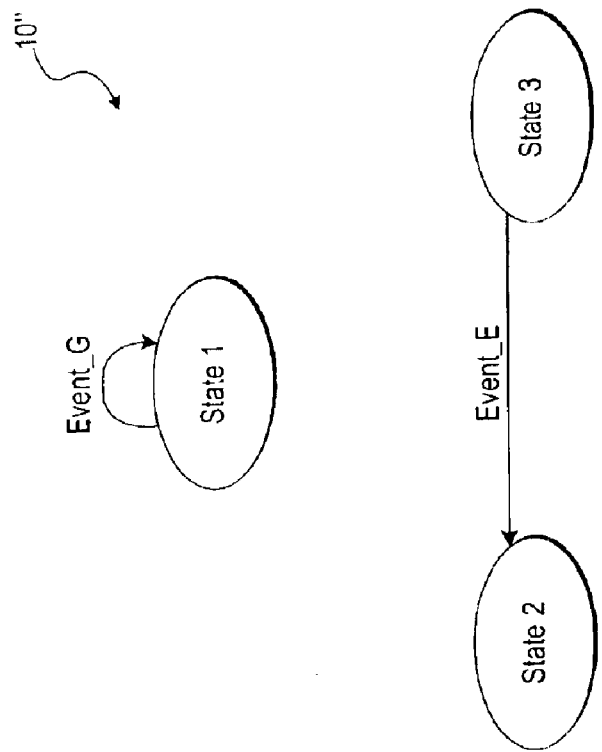
FIGS. 3a and 3b are representations of the state diagram of FIG. 1 adapted for use with the state machine of FIG. 2.
Figure 3A:
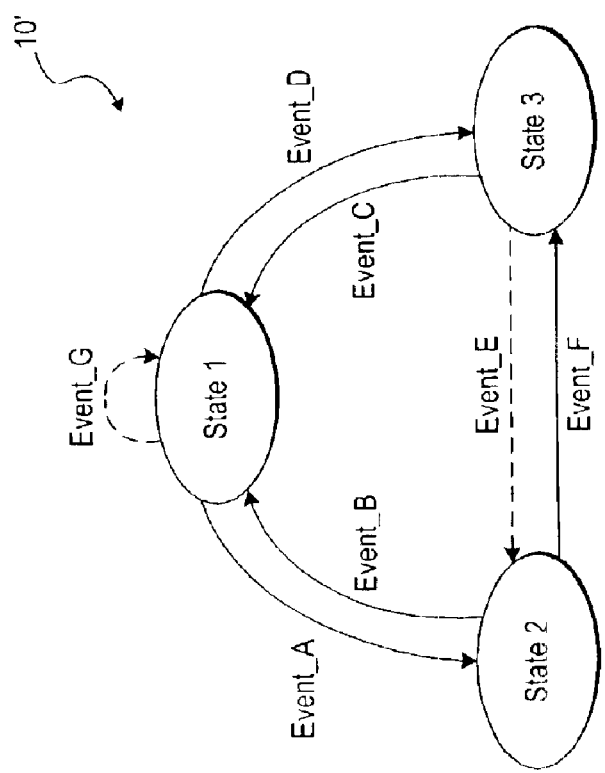

This distribution of the state machine implementation is illustrated in FIGS. 3a and 3b. FIG. 3a illustrates a state diagram 10' for the state machine as implemented by the software component 28. It will be seen that the state transitions resulting from Event_A, Event_B, Event_C, Event_D and Event_F are shown in solid line indicating that these input events are handled normally by the software component 28. Any functions and outputs required in response to Event_A, Event_B, Event_C, Event_D and Event_F are also performed/generated by the software component 28 in normal manner. The state transition in response to Event_E is shown in broken line indicating that this state transition is a shadow transition (since it is assigned to the hardware component 26). When in State 3, in response to Event_E, the software component 28 is required perform only function(s) that are necessary to determine that a state transition from State 3 to State 2 is made. It is not necessary for the software component 28 to perform other functions normally associated with Event_E or to generate corresponding outputs, since this is the responsibility of the hardware component 26. Similarly, the function performed in State 1 in response to Event_G is shown in broken outline indicating that this is a shadow function. When in State 1, in response to Event_G, the software component 28 may conveniently be arranged to perform a null function, or do nothing, since no state transitions are required. It will be noted that, depending on the application, it may be desirable for the software component 28 to perform at least some of the functions and/or to generate the outputs normally associated with an input event even if the hardware component 26 is arranged to handle the event. This may, for example, facilitate verification or reporting of the control system's operation.

FIG. 3b illustrates a state diagram 10" for the state machine as implemented by the hardware component 26. The state transition from State 3 to State 2 in response to Event_E is shown in solid line indicating that this state transition is performed normally by the hardware component 26. All normal function(s) and output(s) in response to Event_E are performed/generated by the hardware component 26. Similarly, when in State 1, the normal function(s) and output(s) that are required in response to Event_G are performed/generated by the hardware component 26. The hardware component 26 is not required to take any further action in the implementation of the state machine. Accordingly, state diagram 10" does not show any other state transitions or functions.

In order to update the hardware component 26 on the current state of the state machine, the software component 28 is arrange to provide an update signal to the hardware component 26 (FIG. 2). Each time the software component 28 determines that a state transition has taken place, it informs the hardware component 26 of the new state, in response to which the hardware component 26 adopts the new state if it is not already in the new state.

Part of the operation of the state machine is now described by way of illustration. Starting in initial State 1, in response to Event_G, the hardware component 26 performs the associated function(s) and generates the corresponding output(s), while the software component 28 does nothing. The state machine remains in State 1. In response to Event_D, the software component 28 performs the associated function(s), generates the corresponding output(s) and performs a state transition to State 3, while the hardware component 26 does nothing. The software component 28 informs the hardware component 26 that the new state is State 3 and the hardware component 26 updates itself to adopt State 3. Subsequently, in response to Event_E, the hardware component 26 performs the state transition to State 2 together with any associated function(s)/output(s). The software component 28 also performs the state transition to State 2 in response to Event_E. Hence, both the hardware and software components 26, 28 arrive independently at State 2, the hardware component 26 performing the associated operations) more quickly and providing the associated output(s) to the target system 22. Subsequent events are handled by the software component 28 until the state machine returns to either State 1 to State 3.

It is not essential that the software component 28 implements all of the states by shadowing at least some of the operations performed by the hardware component 26. In an alternative embodiment (not illustrated) the hardware and software components 26, 28 only implement those states and perform associated event handling operations allocated to them. In such an embodiment, each of the hardware and software components 26, 28 updates the other component 28, 26 in the event of a state transition being implemented. In respect of software component 28 this may be illustrated by removing the broken lines associated with Event_E and Event_G in state diagram 10'. The described embodiment in which the software component 28 shadows at least the state transitions performed by the hardware component 26 is preferred as it provides a convenient means for synchronising the states of the hardware and software components 26, 28.

It will be understood that the hardware component 26 or software component 28 do not need to implement, or support, any state in respect of which they are required to take no action. For example, for the state diagram 10 of FIG. 1, if the only event that the hardware component 26 is required to handle is Event_E, then a suitable state diagram for the hardware component 26 can be obtained by deleting State 1 and Event_G from FIG. 3b. Hence State 1 is omitted completely from the hardware component 26. The software component 28 need only update the hardware component 26 when a state transition occurs to a state in respect of which the hardware component 26 is required to handle one or more events.

In yet an alternative embodiment, the respective roles of the hardware component 26 and software component 28 may be reversed. For example, the hardware component may be arranged to implement state diagram 10' while the software component implements state diagram 10". Such an embodiment would be suitable for applications where most of the event handling operations are required to be performed relatively quickly, while at least some are suitable for slower software implementation.

The control apparatus 24 thus offers a degree of flexibility in that at least some of the operations of the state machine are performed by software and may be modified, if required, with relative ease. Also, the performance of the state machine is improved since time sensitive operations are performed in hardware and may therefore be performed quickly enough to meet the demands of the application. The inclusion of a software component in the state machine also reduces testing time in comparison with a hardware-only state machine implementation.

State machines of the type described herein are particularly suitable for use in the field of telecommunications. In many real-time telecommunications applications it is necessary for a state machine to handle an event under relatively stringent time constraints, for example in less than 100 nanoseconds, and this can prove impractical to perform in software. Consequently, telecommunications state machines are normally implemented in hardware. However, hardware state machines are inflexible and usually require long test times typically ranging from 1 to 100 hours per millisecond of real time for larger circuits.

A case in point is pointer processing in a synchronous transport system, or network, such as Synchronous Digital Hierarchy (SDH)/Synchronous Optical Network (SONET) systems. For example, a state machine implementing pointer interpretation according to ITU-T standard G.783 for a data frame structure comprising 8 interleaved AU-3s and a 125 µs frame (e.g. STS-24/STM-8 traffic), will have to change state after receiving a third consistent normal line pointer in less than 51 nanoseconds. A software state machine operating on a typical 155 MHz processor would require approximately 600 nanoseconds to perform the task.

Figure 4:
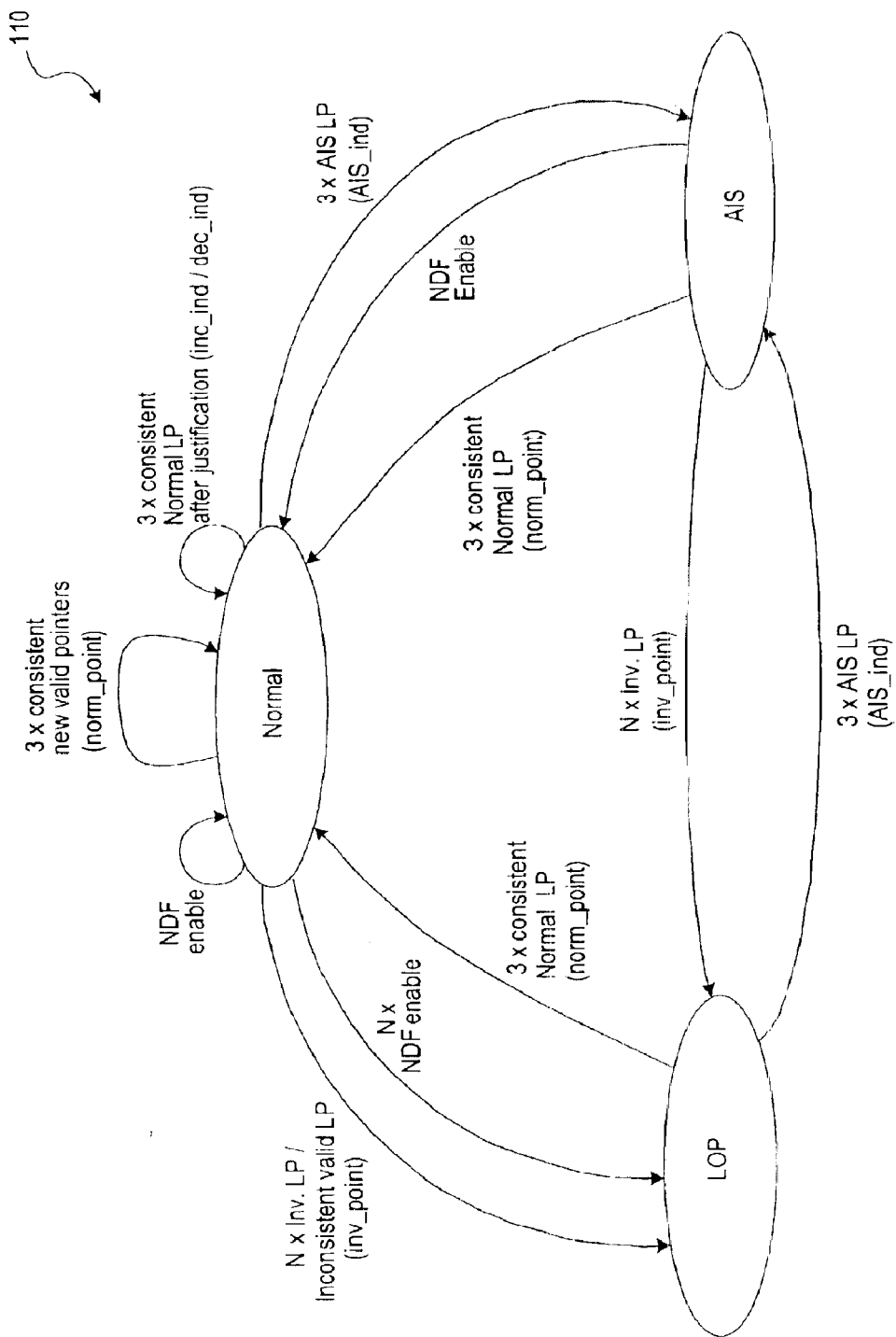
FIG. 4 is a state diagram for Pointer Interpretation according to industry standard ITU-T G.783.
Figure 5:
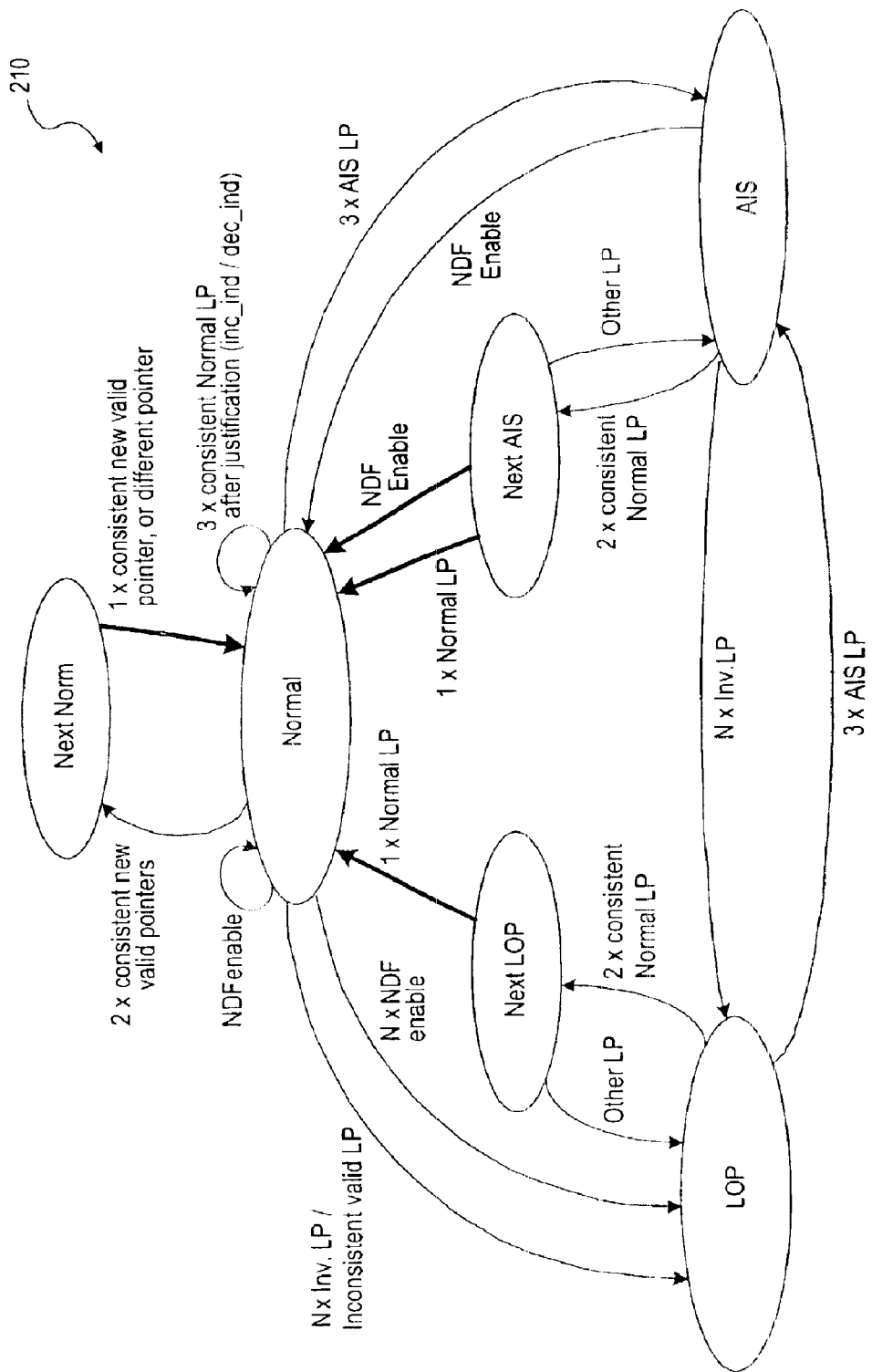
FIG. 5 is an extended version of the state diagram of FIG. 4 which is adapted for use with a state machine embodying the present invention.

FIGS. 4 and 5 illustrate how a hybrid state machine embodying the invention may be implemented to perform, by way of example, pointer interpretation in accordance with ITU-T G.783 (April 1997) "Characteristics of SDH Equipment Functional Blocks", Annex C—Algorithm for Pointer Detection; and ITU-T G.707 (April 2000) Section 8.1.6—Pointer Interpretation; and Bellcore standard GR-253-CORE Issue 2 Rev 2 (January 1999)—"SONET Transport Systems: Common Generic Criteria", especially sections 3.5.1.6 "STS Payload Pointer Interpretation" and 6.2.1.1.3 "Loss of Pointer". These standards are hereby incorporated herein by way of reference.

In the context of this example, the state machine system, or control system 20, comprises a pointer processing system of the general type normally included in SDH/SONET equipment such as multiplexers, cross-connects, and the like. The target system 22 comprises a low order pointer processor (LOPP) and/or a high order pointer processor (HOPP). LOPPs and HOPPS, which are normally implemented in hardware, are required to receive SDH/SONET traffic signals (not shown) and to extract pointer data that is either included therein or associated therewith. The control apparatus 24 is required to process the extracted pointer data and to return control data to the LOPP/HOPP. Conventionally, the role of the control apparatus 24 is performed by a microprocessor (not shown) implementing a software-only state machine.

FIG. 4 shows the conventional state diagram 110 for pointer interpretation according to ITU-T G.783 and includes standard G.783 terminology. There are three states, namely a Normal state, an AIS (Alarm Indication Signal) state and an LOP (Loss of Pointer) state. The Normal State is the regular, error free, state of the pointer interpretation state machine. In this state, the state machine examines received traffic events and either: a) sets the pointer to a new received value; b) increments the pointer; c) decrements the pointer; d) changes state to AIS; e) changes state to LOP; or f) counts events towards taking one of the above actions.

The AIS state is an error condition and is reached from the Normal or LOP states if 3 consecutive AIS traffic events (AIS LP) are received. In the AIS state the state machine either: g) changes state to Normal if an NDF (New Data Flag) event, or h) 3 consistent normal pointer events (Normal LP) are received: i) changes state to LOP if successive invalid pointer (inv. LP) events are received; or j) counts events towards taking one of the above actions.

The LOP state is an error condition and is reached from the AIS or Normal states if successive invalid pointer events are received, or from the Normal state if successive NDF events are received. In the LOP state the state machine either: k) changes state to AIS if 3 consecutive AIS events are received; l) changes state to Normal if 3 consistent normal pointer events are received; or m) counts events towards taking one of the above actions.

For the pointer interpretation state machine described above, the event handling operations, including state transitions, required at a), h) and l) are considered to be time sensitive and, accordingly, in the present embodiment the hardware component 26 of the control apparatus 24 is arranged to perform these event handling operations. The software component 28 is arranged to perform the remaining event handling operations, including state transitions.

In the present embodiment, it is noted that the respective event handling operations, including state transitions, a), h) and l) are performed after the occurrence of respective multiple events, namely the detection of three consistent new valid pointers (in the case of a)) or the detection of three consistent normal pointer events (in the case of h) and l)). In cases where event handling operation(s), which are to be performed by the hardware component 26, are triggered by the occurrence of more than one event in sequence, it is convenient to extend the normal state diagram to include an additional state which the state machine is arranged to adopt in response to the occurrence of the penultimate event in the sequence. This effectively allows the software component 28 of the state machine to arm the hardware component 26 so that it is ready to perform the required event handling operation(s) upon occurrence of the final event in the sequence.

This is illustrated in FIG. 5 which shows and extended version of the state diagram 110 of FIG. 4. In FIG. 5 the state diagram 210 is generally similar to the state diagram 110 but includes an additional, or intermediate, state in respect of each multiple event sequence to be handled by the hardware component 26. Specifically, state diagram 210 includes three extra states, namely Next Norm, Next AIS and Next LOP.

In this embodiment, control apparatus 24 is arranged to implement the state machine described by the state diagram 210. In FIG. 5, bold arrows are used to identify state transitions (and any other associated event handling operations) that are performed by the hardware component 26. It will be seen that the hardware component 26 is arranged to perform all state transitions from the intermediate states to the Normal state. All of the other event handling operations are performed by the software component 28. Preferably, the software component 28 implements all states in the state diagram 210 and performs shadow state transitions corresponding to those state transitions performed by the hardware component 26. The software component 28 is also arranged to inform the hardware component 26 of the current state. In the preferred embodiment, the hardware component 26 is arranged to implement, or support, all states of the state diagram 210, even though the hardware component 26 is not required to perform any event handling operations in respect of the LOP and AIS states. In this embodiment, the software component 28 informs the hardware component 26 when a new state is entered. In an alternative embodiment, the hardware component 26 may be arranged only to implement the intermediate states Next, Norm, Next LOP and Next AIS and the Normal state, and the software component 28 is arranged to inform the hardware component 26 of the new state whenever it determines that an intermediate state has been entered.

The state machine adopts the Next Norm state when, in the Normal state, 2 consistent new valid pointers are received. When this occurs, the software component 28 informs the hardware component 26 that the Next Norm state has been entered. Upon receipt of a further (third) consistent new valid pointer, the hardware component 26 performs the required event handling operations including transition to the Normal State and setting the pointer to the new value. Performing this state transition, and associated pointer setting operation, in hardware allows strict timing requirements to be met. For example, for SDH/SONET traffic with a data frame structure comprising 8 interleaved AU-3s and a 125 $\mu$s frame (e.g. STS-24/STM-8 traffic), the hardware component 26 performs the required event handling operations including transition to the Normal State and setting the pointer to the new value in less than 51 nanoseconds. The software component 28 operating on a typical 155 MHz processor requires approximately 600 nanoseconds to perform the same tasks. If, in the Next Norm state, a different, or non-consistent, pointer is received then the hardware component 26 causes a return to the Normal state without setting a new pointer value.

The state machine adopts the Next LOP state when, in the LOP state, 2 consistent normal pointer events are received. When this occurs, the software component 28 informs the hardware component 26 that the Next LOP state has been entered. Upon receipt of a further (third) consistent normal pointer event, the hardware component 26 performs the required event handling operations including transition to the Normal State and typically also involves clearing an LOP alarm. If, in the Next LOP state, a different, or non-consistent, pointer event is received, the software component 28 causes a state transition to the LOP state.

Similarly, the state machine adopts the Next AIS state when, in the AIS state, 2 consistent normal pointer events are received. When this occurs, the software component 28 informs the hardware component 26 that the Next AIS state has been entered. Upon receipt of a further (third) consistent normal pointer event, or in the event of an NDF enable event, the hardware component 26 performs the required event handling operations including transition to the Normal State, and typically also involves clearing an AIS alarm. If, in the Next AIS state, a different, or non-consistent, pointer event is received, the software component 28 causes a state transition to the AIS state.

By implementing the state machine in both hardware and software, the control apparatus 24 is able to change the states of a much larger number of traffic signals within the available time frame (125 $\mu$s in this example) than would be possible using a software-only state machine.

The state diagram (not shown) for ITU-T G.783 concatenated pointer interpretation may be similarly extended for use with the control apparatus 24. In this case, intermediate states may be introduced between the LOPC state and the Concatenated State, and between the AISC state and the Concatenated state, and the hardware component be arranged to perform the state transition (and associated operations) from the intermediate states to the Concatenated state upon receipt of a third consistent pointer event.

It will be seen, therefore, that the control apparatus 24 implements a hybrid state machine comprising both a software component and a hardware component in which at least some of the states are implemented, supported, or stored, by the software component and at least some states are implemented by the hardware component. In the preferred embodiment, all states are implemented, supported or stored, by the software component and those event handling operations that are performed by the hardware component are shadowed by the software component to keep the software-stored states and the hardware-stored states synchronised. When the software component makes a state transition, it informs the hardware component of the new state, at least in cases where the new state is a state implemented by the hardware component. The resulting hybrid state machine offers the fast performance of a hardware implementation where required, while offering the flexibility and reduced testing times of a software implementation in respect of any aspect of the state machine not implemented in hardware.

The invention is not limited to the embodiments described herein which may be modified or varied without departing from the scope of the invention.

What is claimed is:

1. An apparatus for implementing a state machine having a plurality of states and being responsive to one or more input events to perform one or more functions, the apparatus comprising a software component arranged to implement at least one of said states and being responsive to at least one of said input events to perform one or more functions; and a hardware component arranged to implement at least one of said states and being responsive to at least one of said input events to perform one or more functions, wherein at least one of said states is common to both the hardware component and the software component, and wherein, in respect of the or each common state, one of said hardware component or said software component is arranged to perform one or more functions in response to one or more input events.

2. The apparatus as claimed in claim 1, wherein the other of said hardware component or said software component is arranged to respond to said one or more input events at least to the extent that is necessary to effect a state transition.

3. The apparatus as claimed in claim 1, wherein, in respect of the or each common state, the other of said hardware component or said software component is arranged to perform one or more functions in response to one or more other input events.

4. The apparatus as claimed in claim 1, wherein, in response to effecting a transition from a current state to a next state which is common to both said hardware component and said software component, at least one of said software component and said hardware component is arranged to inform the other of said software component and said hardware component that the next state is adopted.

5. The apparatus as claimed in claim 4, wherein the software component is arranged to implement all of said states and is responsive to said at least one input event at least to the extent that is necessary to effect a transition from a current state to a next state, the software component being further arranged to inform the hardware component when a next state is adopted.

6. The apparatus as claimed in claim 1, wherein the state machine is arranged to perform pointer interpretation in accordance with ITU-T standard G.783.

7. The apparatus as claimed in claim 6, wherein said hardware component is arranged to implement the Normal state and, when the Normal state is adopted, to respond to an input event in the form of a third successive consistent new valid pointer by performing a function in the form of setting the pointer value to the value of the new valid pointer.

8. The apparatus as claimed in claim 6, wherein the hardware component is arranged to implement the Normal state and a Loss of Pointer state, and, when in said Loss of Pointer state, is arranged to respond to an input event in the form of a third successive consistent line pointer event to perform a function including effecting a transition to the Normal state.

9. The apparatus as claimed in claim 8, wherein said Loss of Pointer state is an intermediate state which is entered from the Loss of Pointer (LOP) state provided for in ITU-T G.783 upon receipt of two consistent line pointer events.

10. The apparatus as claimed in claim 6 wherein the hardware component is arranged to implement the Normal state and an Alarm Indication Signal state, and, when in said Alarm Indication Signal state, is arranged to respond to an input event in the form of a third successive consistent line pointer event to perform a function including effecting a transition to the Normal state.

11. The apparatus as claimed in claim 10, wherein said Alarm Indication Signal state is an intermediate state which is entered from the Alarm Indication Signal (AIS) state provided for in ITU-T G.783 upon receipt of two consistent line pointer events.

12. A state machine system comprising a control apparatus and a target system, the control apparatus being arranged to receive one or more input events from the target system, to perform one or more input event handling functions, and to transmit one or more output events to the target system, wherein said control apparatus comprises the apparatus as claimed in claim 1.

13. The state machine system as claimed in claim 12 wherein the hardware component of the control apparatus and the software component of the control apparatus are each arranged to receive input events from said target system and to transmit output events to said target system.

14. The state machine system as claimed in claim 12, arranged to serve as a Synchronous Digital Hierarchy (SDH)/Synchronous Optical Network (SONET) pointer processing system, wherein said target system comprises a low order pointer processor (LOPP) and/or a high order pointer processor (HOPP).

15. A network element for use in a synchronous transport network, the network element comprising the state machine system as claimed in claim 12.

16. In an apparatus for implementing a state machine having a plurality of states and being responsive to one or more input events to perform one or more functions, the apparatus comprising a software component and a hardware component, a method of implementing a state machine, the method comprising arranging said software component to implement at least one of said states and to be responsive to at least one of said input events to perform one or more functions; arranging said hardware component to implement at least one of said states and to be responsive to at least one of said input events to perform one or more functions; causing at least one of said states to be common to both the hardware component and the software component; and, in respect of the or each common state, causing said hardware component or said software component to perform one or more functions in response to one or more input events.

* * * * *